United States Patent
Hwang (10) Patent No.: US 8,363,377 B2
(45) Date of Patent: Jan. 29, 2013

(54) ELECTROSTATIC CHUCK AND APPARATUS HAVING THE SAME

(75) Inventor: Jae Seok Hwang, Seongnam-si (KR)

(73) Assignee: ADP Engineering Co., Ltd., Seongnam-si (KR)

( * ) Notice: Subject to any disclaimer, the term of this patent is extended or adjusted under 35 U.S.C. 154(b) by 684 days.

(21) Appl. No.: 12/255,926

(22) Filed: Oct. 22, 2008

(65) Prior Publication Data

US 2009/0141418 A1 Jun. 4, 2009

(30) Foreign Application Priority Data

Dec. 3, 2007 (KR) .................. 10-2007-0124550

(51) Int. Cl.
*H01L 21/683* (2006.01)
*H01T 23/00* (2006.01)
(52) U.S. Cl. ...................................... 361/234
(58) Field of Classification Search .............. 361/234; 279/128
See application file for complete search history.

(56) References Cited

U.S. PATENT DOCUMENTS

| | | | |
|---|---|---|---|
| 5,352,259 A * | 10/1994 | Oku et al. | 65/412 |
| 6,134,096 A | 10/2000 | Yamada et al. | |
| 6,141,203 A | 10/2000 | Sherman | |
| 7,881,036 B2 * | 2/2011 | Fujisawa et al. | 361/234 |

FOREIGN PATENT DOCUMENTS

WO   WO 2007066572 A1 *  6/2007

* cited by examiner

*Primary Examiner* — Rexford N Barnie
*Assistant Examiner* — Christopher Clark
(74) *Attorney, Agent, or Firm* — KED & Associates, LLP (57) ABSTRACT

An electrostatic chuck and an apparatus having the electrostatic chuck are provided. The electrostatic chuck may attract a substrate during a substrate assembling process for manufacturing a flat display panel. An elastic layer made of an elastic material may be provided in a base part of the electrostatic chuck, thus preventing non-uniform stress from being distributed on the substrate due to external force, therefore maintaining the flatness of the substrate and improving the quality of assembled substrates. The electrostatic chuck may include an electrostatic force generating part provided on an upper surface of the base part, the force generating part including an insulating layer, an electrode layer, a dielectric layer. The base part may be provided with the elastic layer made of the elastic material having elastic restoring force.

9 Claims, 7 Drawing Sheets

ELECTROSTATIC CHUCK AND APPARATUS HAVING THE SAME

This application claims priority to Korean Patent Application No. 10-2007-0124550, filed in Korea on Dec. 3, 2007, the entirety of which is incorporated herein by reference.

BACKGROUND

1. Field

An electrostatic chuck is provided, and more particularly, an electrostatic chuck is provided which attracts a substrate in a substrate assembly process during manufacture of a liquid crystal display (LCD) panel.

2. Background

Various different apparatuses may be used for assembling substrates. Improvements in the various devices used to hold and secure substrates in these apparatuses during processing could improve the assembly process and overall quality of the resulting substrate.

BRIEF DESCRIPTION OF THE DRAWINGS

The embodiments will be described in detail with reference to the following drawings in which like reference numerals refer to like elements wherein.

DETAILED DESCRIPTION

An electrostatic chuck is a part on which a substrate of, for example, glass or wafer, may be placed in a vacuum chamber of a piece of semiconductor or LCD manufacturing equipment. An electrostatic chuck holds the substrate using electrostatic force. More specifically, an electrostatic chuck attracts a substrate using Coulombic force and Johnsen-Rahbeck force which may be generated in a dielectric layer positioned between an electrode and the substrate. Electrostatic chucks may generally be classified into polyimide electrostatic chucks and ceramic electrostatic chucks.

An electrostatic chuck may include a base part and an electrostatic force generating part provided on an upper surface of the base part. The electrostatic force generating part may include an insulating layer, an electrode layer, and a dielectric layer. An object to be attracted, such as a substrate, may be laid on the dielectric layer of the electrostatic force generating part. When voltage is applied to the electrode layer, a positive charge is generated on a side of the dielectric layer facing the substrate, and a negative charge is generated on the other side of the dielectric layer. Thereby, electric energy acts between the positive and negative charges, thus attracting the substrate.

An electrostatic chuck may be used in a substrate manufacturing process. For example, in the case of manufacturing an LCD, after a thin film transistor (TFT) substrate and a color filter (CF) substrate are separately manufactured, these two substrates may be coupled and a liquid crystal material injected between the substrates.

The assembly or coupling of these substrates may be performed by a substrate assembling apparatus having a chamber including upper and lower chambers in which a vacuum may be created. In order to attract the two substrates to be assembled to an upper board of the upper chamber and to a lower board of the lower chamber, respectively, an electrostatic chuck may be used as the substrate attraction means.

In the substrate assembling process, it is important to align the upper and lower substrates such that a constant interval between the upper and lower substrates is maintained and the substrates are kept in parallel and flatness is maintained, because this affects the quality of a product resulting from this assembling process. In order to maintain the interval and parallelism between the upper and lower substrates in the substrate assembling apparatus, a z-axis fine alignment device may be used to align central mark points of the respective substrates. The fine alignment means may also improve parallelism. Other systems may also be used, as appropriate.

However, this process does not provide for an adjustment in the flatness of the entire surface of the substrate owing to the deformation of the substrate. More specifically, non-uniform stress applied to the substrate may cause the substrate to deform. Moreover, the larger the substrate to be processed is, the worse the deformation may be, and the worse the flatness becomes. Non-uniform stress is applied to the substrate because stress is changed due to sagging of the chamber caused by a load on the chamber, and also because stress changes due to a difference in pressure when a vacuum is created in the chamber during the substrate assembling process. In absence of some means for preventing the chamber from becoming deformed, the deformation is transferred to the substrate, resulting in deformation of the substrate and deterioration of the quality of the assembled substrates.

Since the deformation caused by the load of the chamber is a static deformation, it can be dealt with by adjusting an initial set value. However, the deformation caused by the difference in pressure is a dynamic deformation, and thus the elimination of this deformation may be more difficult. Particularly, the dynamic deformation occurring in the upper chamber may be more serious than the deformation occurring in the lower chamber, which may be secured to, and thus supported by, a base frame. Hereinafter, for ease of discussion, the deformation due to the difference in atmospheric pressure will be described in detail with reference to the upper chamber.

The substrate assembling process described above is conducted in a chamber in which a vacuum has been created. At this time, compressive force is generated inside and outside the chamber due to the difference in pressure between the inside and outside of the chamber. This compressive force causes a central portion of the chamber to sag and deform. The deformation is transferred to the inside of the chamber and also to the electrostatic chuck which is mechanically fastened to the chamber. Eventually, the deformation is transmitted to the substrate held by the electrostatic chuck, causing the substrate to sag.

Figure 1:
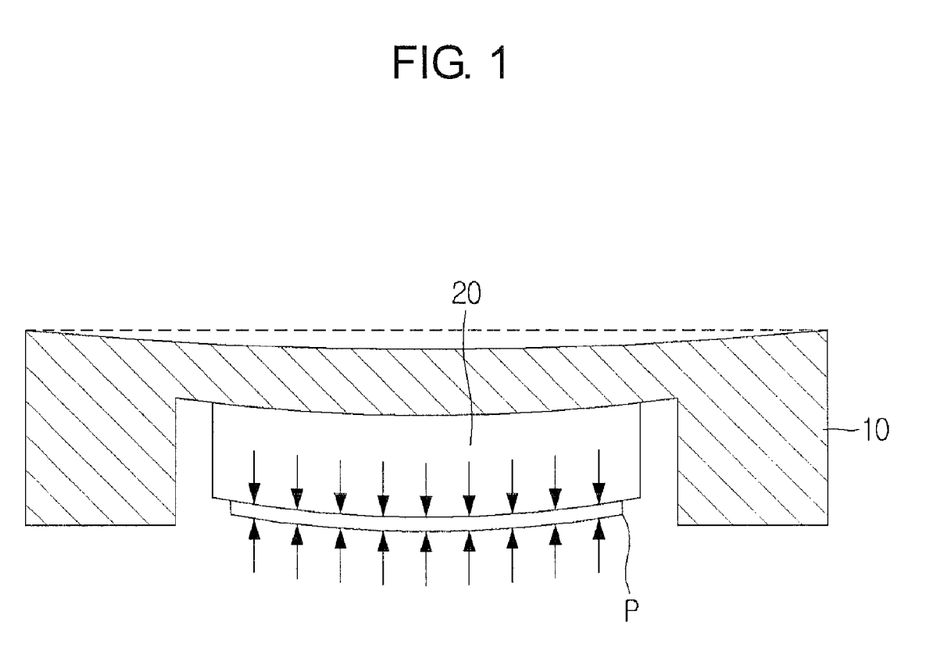
FIG. 1 is a sectional view illustrating the deformation of a chamber and the deformation of a substrate caused by the deformation of the chamber.

FIG. 1 illustrates the deformation of a substrate caused by the deformation of a chamber as discussed above. As shown in FIG. 1, when the chamber 10 is evacuated so that a vacuum is created in the chamber 10, compressive force acts from the outside to the inside of the chamber 10 due to the difference in atmospheric pressure between the outside and the inside. In the example shown in FIG. 1, the compressive force causes the central portion of the chamber 10 to bend and deform. The deformation affects the substrate P attracted to the chamber 10 by a substrate support 20, so that the central portion of the substrate P is also bent and deformed.

Figure 2:
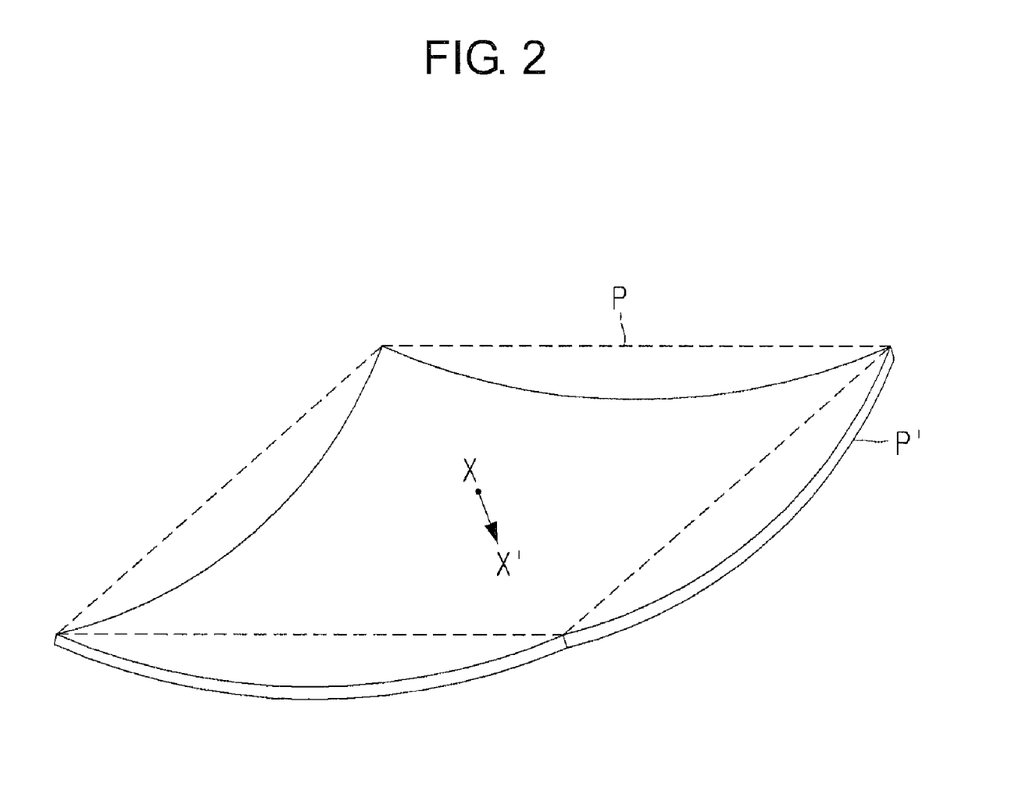
FIG. 2 illustrates a deterioration in flatness due to deformation of the substrate shown in FIG. 1.

FIG. 2 shows a substrate P before deformation (in dotted line) and the same substrate P' after deformation (in solid line). As shown in FIG. 2, the central point X of the alignment mark of the substrate P before deformation is different from the central point X' of the alignment mark of the substrate P' after deformation. This illustrates how the flatness of the substrate is negatively affected.

When flatness is reduced as shown in FIG. 2 and both the substrates are compressed during assembly, an interval between the two substrates is irregular. In the example shown in FIG. 2, an interval between the central portions of the substrates is smaller than an interval between the peripheral portions of the substrates. That is, the interval between the substrates is non-uniform, thus deteriorating the quality of the assembled substrates.

An electrostatic chuck and a substrate assembling apparatus having the electrostatic chuck as embodied and broadly described herein will now be discussed with reference to FIGS. 3 to 7.

Figure 3:
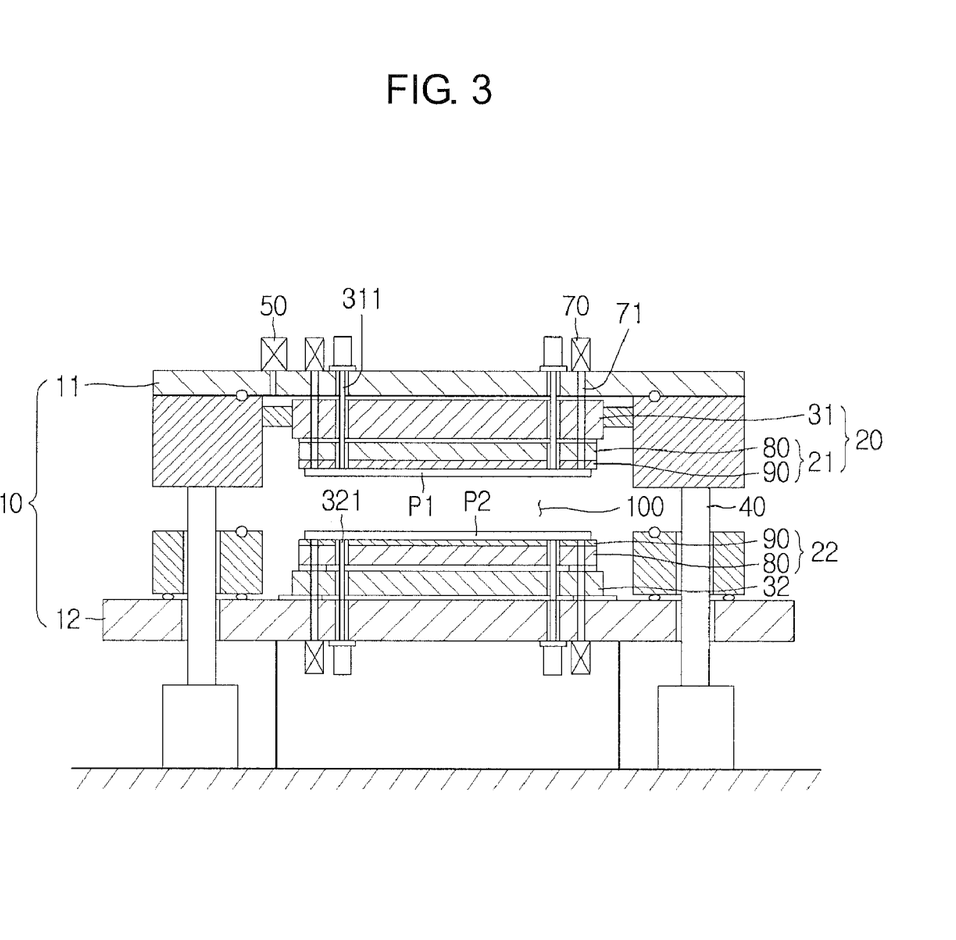
FIG. 3 is a sectional view of a substrate assembling apparatus as embodied and broadly described herein.

As shown in FIG. 3, a substrate assembling apparatus may include an upper chamber 11 in which an upper substrate P1 is seated, and a lower chamber 12 in which a lower substrate P2 is seated. The lower chamber 12 may be secured to a base frame (not shown), and the upper chamber 11 may be raised and lowered by a moving device 40.

An upper electrostatic chuck 21 may be provided in the upper chamber 11 to seat the upper substrate P1 therein, and a lower electrostatic chuck 22 may be provided in the lower chamber 12 to seat the lower substrate P2 therein. The upper electrostatic chuck 21 may be mounted on an upper board 31 provided in the upper chamber 11, and the lower electrostatic chuck 22 may be mounted on a lower board 32 provided in the lower chamber 12. The upper and lower electrostatic chucks 21 and 22 may respectively include a plurality of pins 311 and 321 which retractably protrude through the upper and lower boards 31 and 32.

When the lower substrate P2 enters the lower chamber 12, the lower pins 321 may move upwards to receive the substrate P2. Subsequently, the lower pins 321 may move downwards so that the lower substrate P2 is placed on the lower electrostatic chuck 22. Further, when the assembling process has been completed, so that the upper substrate P1 and the lower substrate P2 are assembled into a panel, the lower pins 321 may extend from the lower board 32 to move the assembled panel upwards in order to transfer the panel to the outside.

A camera 70 may be provided with the upper chamber 11 so as to capture an image of alignment marks indicated on the upper and lower substrates P1 and P2 and determine whether the substrates P1 and P2 are located at a precise assembling position. The camera 70 may capture the image of the alignment marks through a hole 71 that extends through the upper chamber 11.

Further, when the upper and lower chambers 11 and 12 come into close contact with each other to form a processing space, a vacuum means 50 such as, for example, a turbo molecular pump (TMP), a dry pump, or other type of pump as appropriate, may be connected to the processing space so as to create a vacuum therein.

Electrostatic chucks which may be used as the upper or lower electrostatic chuck 21 or 22 of the substrate assembling apparatus shown in FIG. 3 will be described with reference to FIGS. 4 to 6.

Figure 4:
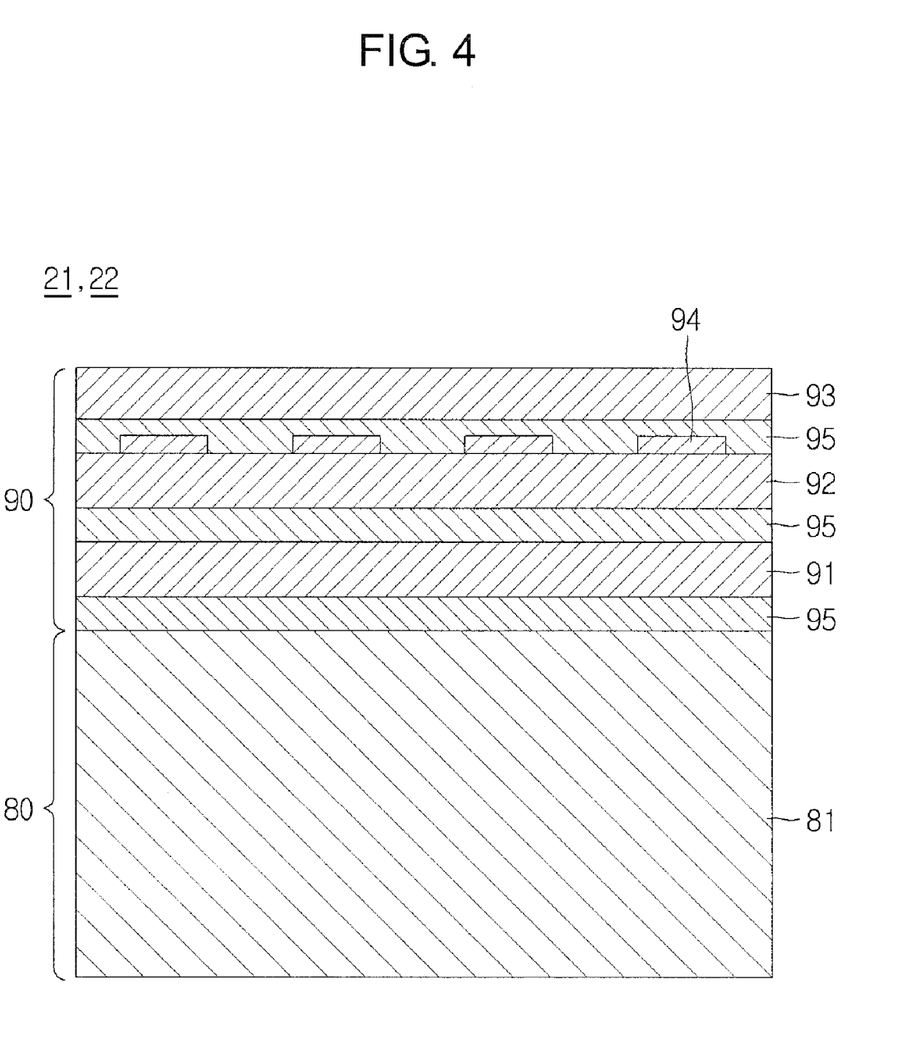
FIG. 4 is a sectional view of an exemplary electrostatic chuck of the substrate assembling apparatus shown in FIG. 3.

FIG. 4 is a sectional view of an exemplary electrostatic chuck of the substrate assembling apparatus shown in FIG. 3, in which a base part 80 of the electrostatic chuck 21/22 includes a urethane material having an elastic quality.

As shown in FIG. 4, the base part 80 of the electrostatic chuck 21/22 may include a urethane elastic layer 81. An electrostatic force generating part 90 may be provided on the upper surface of the base part 80. The electrostatic force generating part 90 may include an insulating layer 91 made of, for example, a polyimide film, an electrode layer 92 made of, for example, a copper film and having electrode 94 formed thereon, and a dielectric layer 93 made of, for example, a polyimide film. The insulating layer 91, the electrode layer 92, and the dielectric layer 93 may be attached to each other using, for example, adhesive films 95.

The base part 80 may have various shapes, based on a shape of a substrate to be processed. For example, in an LCD panel manufacturing process, the base part 80 may have a rectangular block shape. The base part 80 fabricated in this way may be coupled to the electrostatic force generating part 90 as shown in FIG. 4. Although a method of supplying power to the electrodes 94 formed on the electrode layer 92 is not illustrated in detail in the drawings, the electrodes 94 may be connected to a DC power supply device (not shown).

The electrostatic chuck 21/22 shown in FIG. 4 may be fastened to the board 31/32 in the chamber 11/12 through various fastening means, and a plurality of pin through holes may be formed through the electrostatic chuck 21/22 to accommodate the plurality of pins 311/321.

Figure 5:
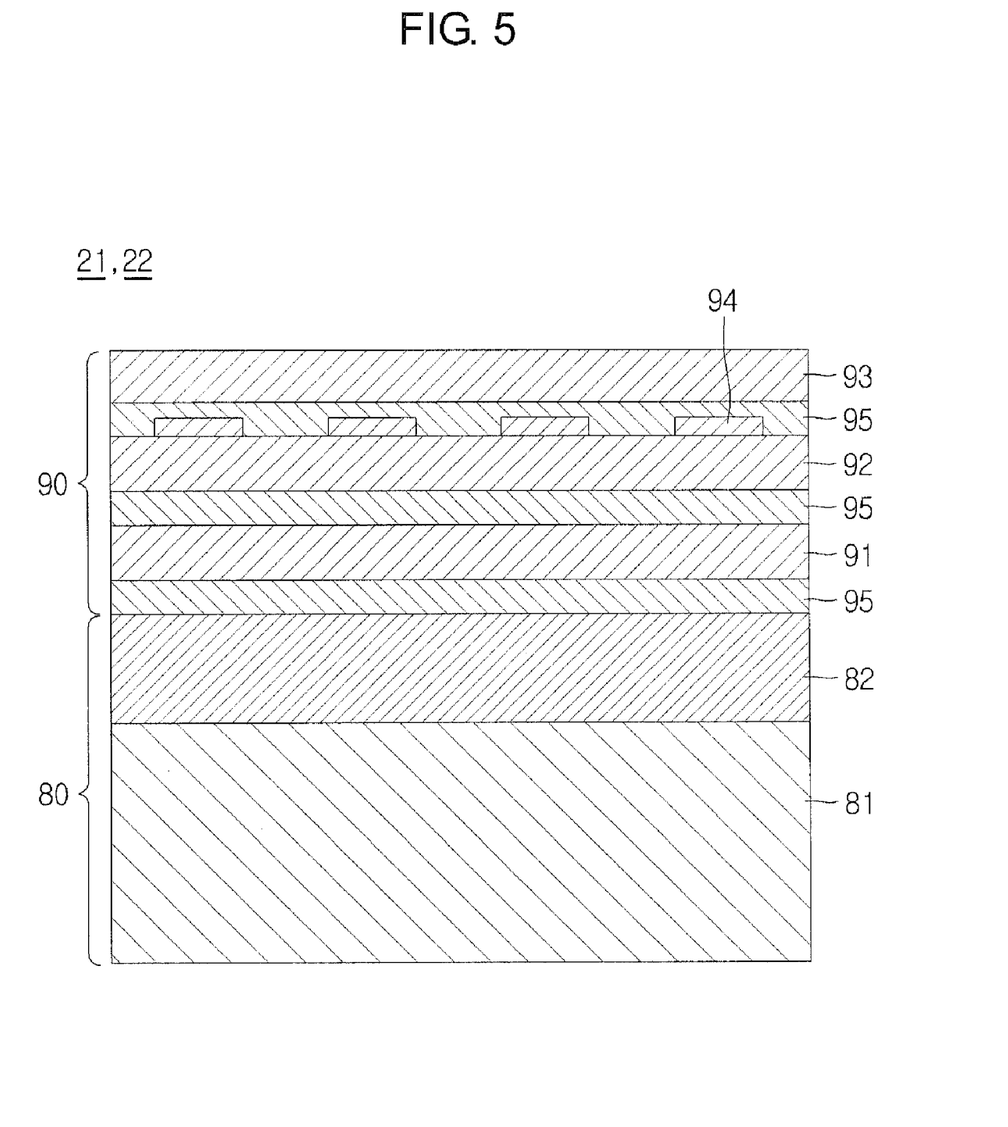
FIG. 5 is a sectional view of another exemplary electrostatic chuck of the substrate assembling apparatus shown in FIG. 3.

FIG. 5 is a sectional view of another exemplary electrostatic chuck 21/22 of the substrate assembling apparatus shown in FIG. 3. As shown in FIG. 5, the base part 80 of the electrostatic chuck 21/22 may have a two-layer structure having a urethane elastic layer 81 and an aluminum layer 82 which is provided on the upper surface of the urethane elastic layer 81 so that the insulating layer 91, the electrode layer 92, and the dielectric layer 93 are sequentially stacked on an upper surface of the aluminum layer 82. The aluminum layer 82 may be added to the base part 80 of the electrostatic chuck, 21/22 to more efficiently protect the electrostatic force generating part 90 against the deformation of the base part 80.

Figure 6:
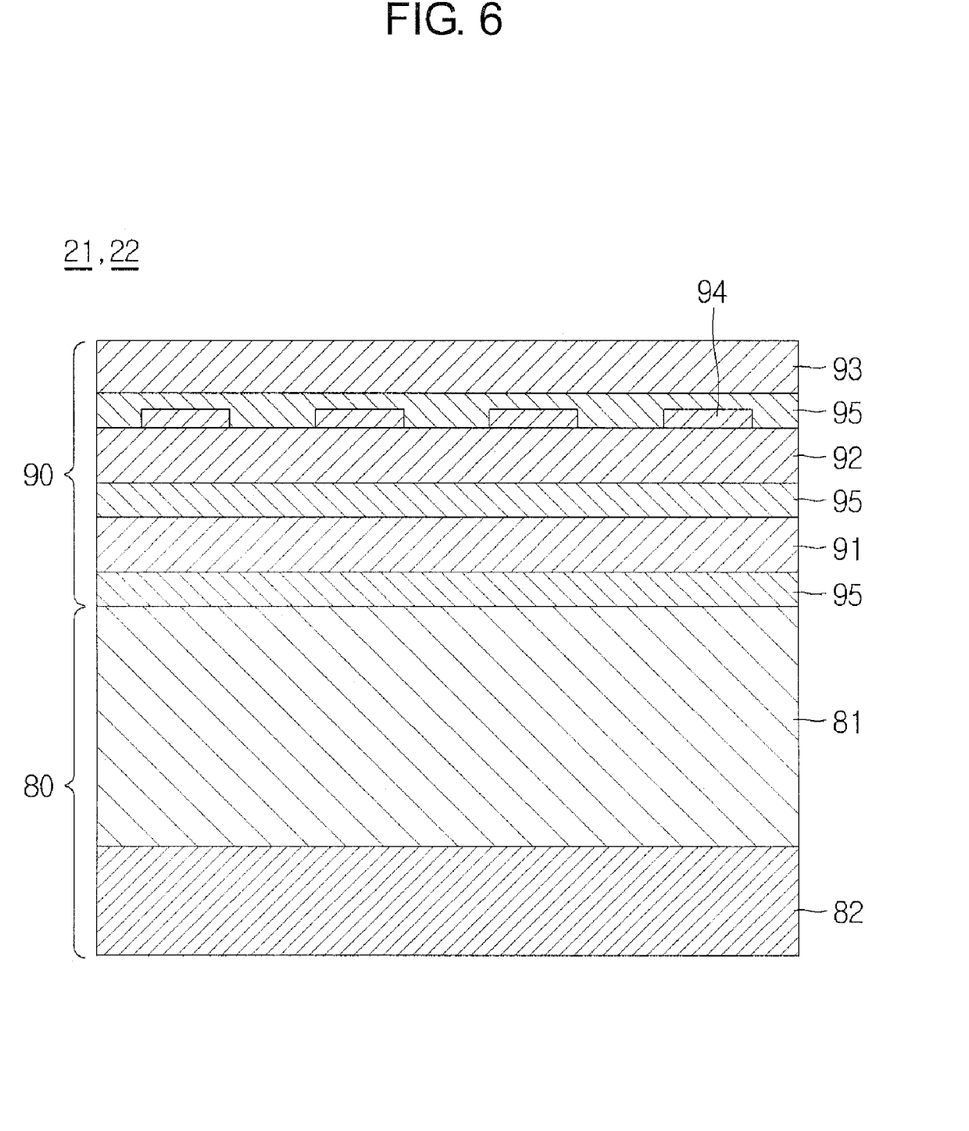
FIG. 6 is a sectional view of another exemplary electrostatic chuck of the substrate assembling apparatus shown in FIG. 3.

FIG. 6 is a sectional view of another exemplary electrostatic chuck 21/22 of the substrate assembling apparatus shown in FIG. 3. As shown in FIG. 6, the base part 80 of the electrostatic chuck 21/22 may have a two-layer structure having an aluminum layer 82 and a urethane elastic layer 81 which is provided on the upper surface of the urethane elastic layer 81 so that the insulating layer 91, the electrode layer 92, and the dielectric layer 93 are sequentially stacked on an upper surface of the urethane layer 81.

Operation of a substrate assembling apparatus and the shock absorbing function of the electrostatic chuck, as embodied and broadly described herein, will now be discussed.

When the upper substrate P1 is transferred into the space 100 between the upper chamber 11 and the lower chamber 12 by a substrate transferring robot (not shown), with the upper chamber 11 and the lower chamber 12 spaced apart from each other, the upper pins 311 provided on the upper chamber 11 move downwards and exert an attractive force on the upper substrate P1. The upper pins 311 move upwards, and upper substrate P1 also moves upwards as it is attracted by the upper pins 311. The upper substrate P1 then contacts and is attached to the upper electrostatic chuck 21 provided on the upper board 31, and the attractive force from the upper pins 311 is released.

When the lower substrate P2 is transferred into the space 100 by the substrate transferring robot, the lower pins 321 move upwards to receive the lower substrate P2 thereon, and the robot moves to the outside. Subsequently, the lower pins 321 move downwards, and the lower substrate P2 is seated on and attached to the lower electrostatic chuck 22.

The upper chamber 11 is then moved downwards by the movement device 40 until the upper chamber contacts the lower chamber 12, so that a hermetic process space 100 is formed between the upper chamber 11 and the lower chamber 12. The hermetic process space 100 may maintain a vacuum state by operation of the vacuum means 50. At this time, the upper board 31 moves downwards, and the upper substrate P1 is positioned proximate the lower substrate P2.

The alignment of the upper substrate P1 and the lower substrate P2 is broken down into an XYθ axis alignment that aligns the alignment marks provided on the substrates P1 and P2 with each other, and a Z-axis alignment that adjusts interval and parallelism between the substrates P1 and P2. When final alignment is completed, the upper substrate P1 is positioned on the lower substrate P2 so that the upper and lower substrates P1 and P2 are assembled with each other.

After this initial, pre-assembly of the substrates P1 and P2, the supply of power to the electrostatic chucks 21 and 22 is interrupted, and the upper substrate P1 is released from the electrostatic chuck 21 to be assembled with the lower substrate P2 which is provided at a lower position.

The processing space 100 is then exhausted, and the substrate assembling apparatus is placed in a waiting mode. Although not shown in the drawings, N2 gas supplied from the upper chamber 11 so that the upper substrate P1 and the lower substrate P2 be more firmly assembled together.

When the substrates P1 and P2 have been fully assembled, the upper chamber 11 and the lower chamber 12 are moved away from each other, and the lower pins 321 of the lower chamber 11 are moved upwards so that the substrate transferring robot may transfer the assembled substrates out of the processing space 100. Through such a process, the assembling process is completed.

In this process, an electrostatic chuck as embodied and broadly described herein may absorb shocks, such as, for example, compressive force, so that the deformation of the chamber due to vacuumization is not transmitted to the substrate, thus maintaining the flatness of the substrate surface and remarkably improving the quality of the assembled substrates. These types of electrostatic chucks may have numerous applications, including, for example, a substrate attaching apparatus or an organic deposition apparatus as discussed in U.S. application Ser. Nos. 12/255,099 and 12/255,160, the entirety of which is incorporated herein by reference.

An electrostatic chuck as embodied and broadly described herein may include an elastic layer made of an elastic material in the base part, thus solving the problem of non-uniform stress being transmitted to the substrate due to the deformation of the chamber by virtue of the elastic restoring force of the elastic material, thereby improving the flatness of the substrate and enhancing the quality of the assembled substrates.

In particular, the elastic layer may be provided in the base part of the electrostatic chuck so that an additional device is not required in the substrate assembling apparatus, thereby realizing a simple and economical construction.

Hereinafter, the features of an electrostatic chuck having a layer made of elastic material as embodied and broadly described herein will now be discussed.

Figure 7:
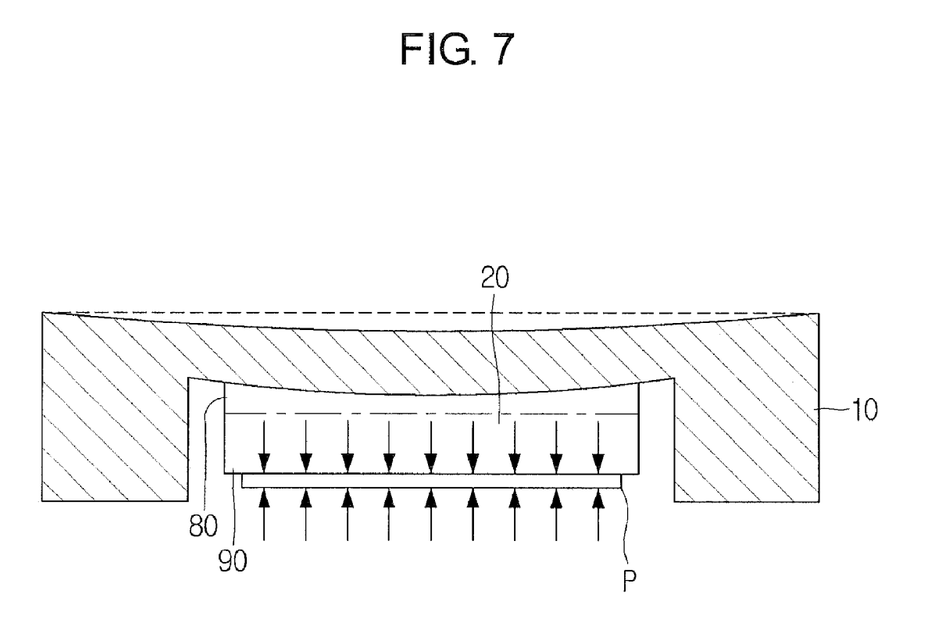
FIG. 7 is a sectional view of a substrate in which deformation is reduced by the electrostatic chuck of the substrate assembling apparatus as embodied and broadly described herein.

The deformation of the chamber 10 by external force may be constant but not uniform and shows variation according to position. In the case where there is no shock absorbing means, as shown, for example, in FIG. 1, the deformation is transmitted to the substrate, as described above. In contrast, a substrate support unit 20 having shock absorbing means serves to provide an elastic restoring force that counteracts the deformation and also serves to disperse the external force more uniformly. Thereby, the distribution of stress may be non-uniform on one surface of the substrate support unit 20 having the shock absorbing means which is in contact with the chamber 10, and that surface shows deformation corresponding to the deformation of the chamber 10. But, the distribution of stress becomes substantially uniform and the effect of local deformation may be reduced towards a surface opposite the surface to which the substrate P is attached. Consequently, uniform stress may be applied to the substrate P, so that the substrate P can maintain initial flatness, as shown in FIG. 7.

As the elastic material used in the base part 80 of the electrostatic chuck, a material which has superior shape-restoring force when external force is eliminated and does not transmit the effect of local deformation is preferable. Further, a material which is resistant to various pollution sources present during the manufacturing process and has good processability is preferable. As such a material, such as, for example, rubber made of a urethane material, is preferable. Other materials may also be appropriate for the elastic material in accordance with the deformation characteristics of the substrate, the conditions of use, and other such factors.

An electrostatic chuck of a substrate assembling apparatus is provided which has shock absorbing means which reduces transmission of deformation from a chamber to a substrate.

Such shock absorbing means may be obtained by manufacturing a base part of an electrostatic chuck using an elastic material which may be elastically deformed without adding an additional device to the substrate assembling apparatus. Alternatively, the shock absorbing means may be obtained by adding an elastic material to the base part of an electrostatic chuck.

An electrostatic chuck as embodied and broadly described herein may include a base part which has an elastic material layer, and an electrostatic force generating part which is provided on the upper surface of the base part and has an insulating layer, an electrode layer, and a dielectric layer.

Any reference in this specification to "one embodiment," "an embodiment," "example embodiment," "certain embodiment," "alternative embodiment," etc., means that a particular feature, structure, or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electrostatic chuck, comprising:
   a base part including an elastic layer made of an elastic material and having an elastic restoring force, and a non-elastic layer made of Aluminum positioned directly on an upper surface of the elastic layer; and
   an electrostatic force generating part positioned directly on an upper surface of the non-elastic layer of the base part, opposite a lower surface thereof contacting the elastic layer, wherein the electrostatic force generating part includes:
      an insulating layer positioned directly on the upper surface of the non-elastic layer;
      an electrode layer positioned directly on an upper surface of the insulating layer; and
      a dielectric layer positioned directly on an upper surface of the electrode layer.

2. The electrostatic chuck of claim 1, wherein an exposed upper surface of the dielectric layer defines a substrate receiving surface.

3. The electrostatic chuck of claim 1, wherein the elastic layer of the base part absorbs an external force imparted thereon such that the force is not transmitted to the electrostatic force generating part.

4. The electrostatic chuck of claim 1, wherein the elastic layer is made of a urethane material.

5. The electrostatic chuck of claim 1, wherein the elastic layer deforms to absorb an external force imparted thereon while the non-elastic layer retains its shape such that the external force is not transmitted to the electrostatic force generating part.

6. An electrostatic chuck for a substrate assembling apparatus that is used to assemble substrates of a flat display panel, the electrostatic chuck comprising:
   a base part including an elastic layer made of an elastic material having an elastic restoring force and a non-elastic layer adhered directly on an upper surface of the elastic layer and made of Aluminum; and
   an electrostatic force generating part adhered directly on an upper surface of the non-elastic layer of the base part, wherein the elastic layer of the base part absorbs an external force imparted thereon such that the external force is not transmitted to the electrostatic force generating part.

7. The electrostatic chuck of claim 6, wherein the electrostatic force generating part comprises:
   an insulating layer adhered directly on the upper surface of the non-elastic layer of the base part;
   an electrode layer adhered directly on an upper surface of the insulating layer; and
   a dielectric layer adhered directly on an upper surface of the electrode layer and having an exposed surface that forms a substrate receiving surface.

8. The electrostatic chuck of claim 6, wherein the elastic layer is made of a urethane material.

9. The electrostatic chuck of claim 6, the wherein the elastic layer deforms to absorb an external force imparted thereon while the non-elastic layer retains its shape such that the external force is not transmitted to the electrostatic force generating part.

* * * * *